INVENTORS.
FRANK W. GUTZWILLER
E. KEITH HOWELL
BY *Melvin M. Goldenberg*
ATTORNEY INVENTORS.
FRANK W. GUTZWILLER
E. KEITH HOWELL
BY Melvin M. Goldenberg
ATTORNEY United States Patent Office 3,535,615

Patented Oct. 20, 1970

3,535,615

POWER CONTROL CIRCUITS INCLUDING A BIDIRECTIONAL CURRENT CONDUCTING SEMICONDUCTOR

E. Keith Howell, Skaneateles, N.Y., and Frank W. Gutzwiller, Erie, Pa., assignors to General Electric Company, a corporation of New York Continuation of application Ser. No. 343,300, Feb. 7, 1964. This application Nov. 6, 1967, Ser. No. 692,615

Int. Cl. G05f *1/40*

U.S. Cl. 323—22 20 Claims

ABSTRACT OF THE DISCLOSURE

A number of power control circuits are provided utilizing controlled bidirectional current conducting semiconductors for delivery of electrical power to a load. These semiconductors normally exhibit a high impedance characteristic between two main current carrying terminals. When a relatively low power control signal is applied to a third or gate terminal, the device switches to a second low impedance state. The semiconductors are bilateral in nature and permit current conduction in either direction. Triggering circuits are provided operative to control the conduction periods of such semiconductors in accordance with certain parameters, such as the varying characteristic of a load in the power control circuit. During such conduction periods, the triggering circuits develop control signals that attain a magnitude sufficient to switch the semiconductors to the low impedance state.

The present invention is a continuation of our copending application Ser. No. 343,300, filed Feb. 7, 1964, and now abandoned, and assigned to the same assignee as the present invention.

This invention relates to circuitry for the selective supply of power to a load. More particularly, the invention relates to the employment of bidirectional current conducing semiconductor devices for controlling the amount of power delivered to a load.

The continuous growth of electrically operated equipment in all fields of endeavor has focused attention upon the means used for supplying the power to such equipment. It is fully appreciated that not only the generation of electrical power but also its delivery to the equipment in usable form is important. Accordingly, considerable design effort has been concentrated on circuitry for suitably supplying power to a wide variety of load circuits. Among the great number of important characteristics that must be weighed in the selection of any particular power control circuit must be included the cost factor. This in turn may be broken into the initial cost of construction, the operating costs, and the maintenance costs. Further characteristics include the space requirements of the circuit, the operating environment within which it must work, and perhaps of greatest importance, the sensitivity and efficiency with which the circuit functions to accomplish a desired type of operation.

An object of the present invention is to provide improved power control circuitry exhibiting the characteristics of low cost, small size, and high reliability.

From an operational standpoint, the merit of a power control circuit is a function of the manner in which it performs while accomplishing desired objectives. Generally speaking, power control circuits are used to control either the amount of power delivered to a load, the duration of the power application, or both. The accuracy with which the power control circuit responds to input stimuli to effect the desired power control function is of extreme importance.

Another object of the present invention is to provide improved power control circuitry which accurately responds to input stimuli.

In addition to accuracy of response to input stimuli, the particular nature of the required stimulus is important. Thus, it is most desirable to effect control over a maximum amount of supplied energy with a minimum amount of power dissipation in the control circuitry. Power dissipation may be attributed to both the particular components employed and to the number of such components required.

Another object of the present invention is to provide circuitry that is operative in response to low power control signals to effect control over the supply of relatively large amounts of energy.

Still another object of the invention is to provide power control circuitry using a minimum number of components and wherein each of said components is characterized by relatively low power consumption.

The problem of reliability has been touched upon hereinbefore and the objective of increasing the reliability of power control circuits is inherent in the present invention. Such reliability may be evidenced by optimum ability to withstand physical shock and varying environmental conditions, and relative immunity from electrical failure due to over-voltage. Aside from the individual characteristics of each component in a circuit, it is well known that merely reducing the number of components generally reduces the probability of circuit failure.

Accordingly, from another aspect, the present invention has as an object the provision of improved power control circuits employing a minimum number of highly reliable components.

The relatively recent development of semiconductor devices has provided a new dimension in the area of electrical equipment reliability, size, and power consumption. In the power supply and control field, the silicon controlled rectifier has provided particular advantages. Silicon controlled rectifiers are basically three-terminal semiconductor rectifiers operative to switch from a high to a low impedance state between two main terminals in response to a relatively short low power impulse on a gate terminal. To control the supply of alternating current power, two such devices, connected with opposing orientations, are generally interposed between the supply and a load. Control circuitry is used to selectively deliver independent triggering pulses to each device in accordance with a desired operating scheme. To reduce the cost and complexity of such arrangements, one of these controlled rectifiers may be eliminated by using a bridge circuit wherein four conventional rectifiers provide the bridge and a single controlled rectifier is connected across its output. Even though this technique reduces the required number of controlled rectifiers and perhaps the complexity of the triggering circuitry, it does so at the expense of added conventional rectifiers, significantly increased heat dissipation, and often at the increased risk of circuit failure.

The invention of controlled bi-directional current conducting semiconductors has provided the answer to the need for simple control over the delivery of alternating current power. These semiconductors normally exhibit a high impedance characteristic between two main current carrying terminals. When a relatively low power triggering impulse is applied to a third or gate terminal, the device switches to a second state wherein a low impedance exists between the current carrying terminals. These semiconductors are bilateral in nature and permit current conduction in either direction with equal facility. Furthermore, the triggering impulses required to effect switching from a high to a low impedance state may generally be of either polarity. Obviously, the bilateral characteristic of the main current conducting path and the flexibility offered by the permissible forms of triggering impulses render the bi-directional current conducting semiconductors admirably suited for control of alternating current.

Another object of the present invention is to provide power control circuits employing bi-directional current conducting semiconductors.

Still another object of the present invention is to provide circuits which simply and effectively combine a minimum of conventional circuit elements with bidirectional current conducting semiconductors in order to produce unique power control systems exhibiting heretofore unattainable characteristics with this degree of simplicity.

Basically, the present invention is embodied in a number of illustrative circuits utilizing bidirectional current conducting semiconductors. The embodiments include triggering circuits operative to control the conduction periods of such semiconductor devices in accordance with desired criteria. In general, the triggering circuits develop control signals that attain a magnitude sufficient to initiate switching of the semiconductor devices during successive half cycles of the alternating current supplied. In accordance with the invention and as illustrated by the embodiments hereinafter, a single bi-directional current conducting semiconductor exhibiting a possible duty cycle approaching one hundred percent is employed for full-wave control of alternating current power.

The features of the invention are set forth with particularity in the appended claims. The invention itself, however, both as to its organization and method of operation together with further objects and features thereof, may best be understood by reference to the following description taken in conjunction with the accompanying drawings wherein:

FIGS. 1A, 1B, and 1C illustrate respectively: a diagrammatic representation of one form of controlled bi-directional current conducting semiconductor, a symbolic representation for such a device, and typical characteristic operating curves of such a device;

FIGS. 2A, 2B, and 2C illustrate respectively: a diagrammatic representation of a bidirectional current conducting semiconductor device switchable to a low impedance state when the voltage across its two sole terminals exceeds a predetermined magnitude, a symbolic representation for such a device, and typical characteristic operating curves of such a device;

Figure 6:
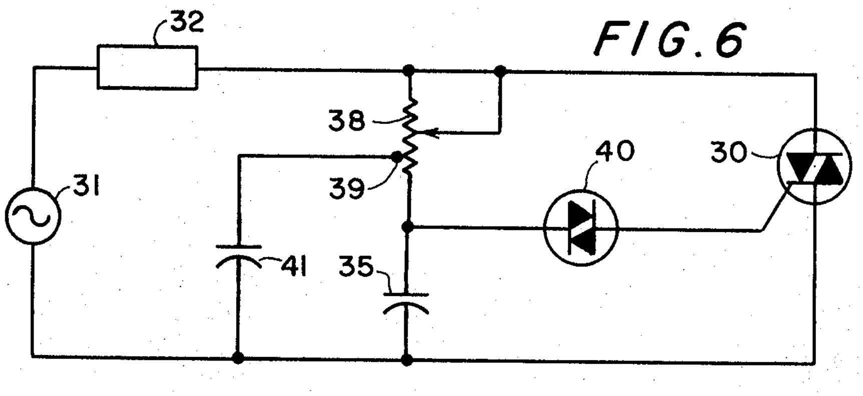
Figure 7:
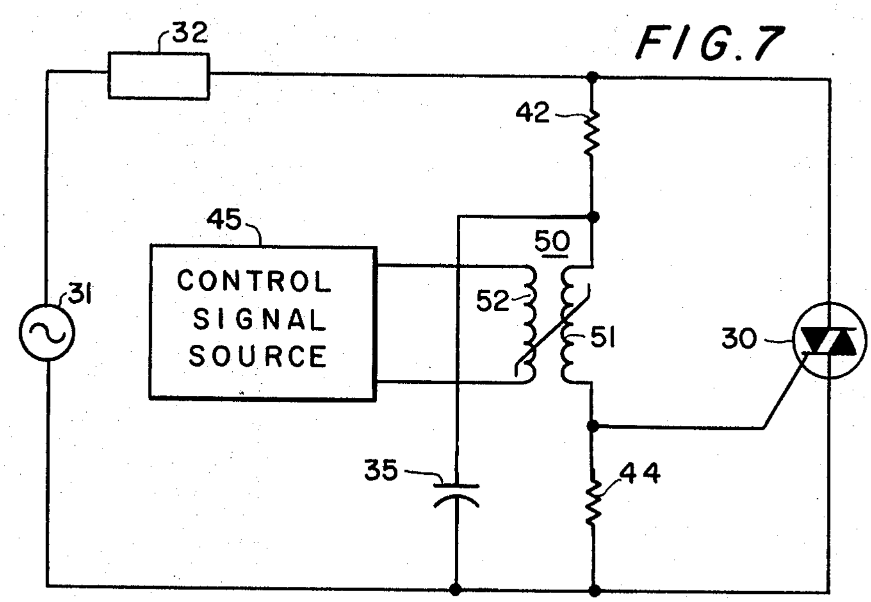

FIG. 6 is a circuit schematic illustrating a bidirectional current conducting semiconductor power control circuit wherein the control signal is developed by what is in effect a double-time-constant phase shift circuit; and FIG. 7 is a circuit schematic illustrating a bidirectional current conducting semiconductor power control circuit wherein control signals are generated by means of a saturable core device that is controlled in turn by an electrically isolated source.

Controlled bidirectional current conducting semiconductors

A general understanding of controlled bidirectional current conducting semiconductors (hereafter referred to as controlled bilateral devices) is required in order to understand and appreciate the invention as embodied in the illustrative circuits described hereinafter. Broadly speaking, these three-terminal devices can be constructed to furnish four modes of operation. The modes of operation differ in the direction of current flow between the main current conduction carrying terminals of the device and in the required direction of current flow into the trigger terminal of the device in order to make it switch from a high to a low impedance state. If the device is arbitrarily designated, as shown in FIG. 1B, to have main current carrying terminals 1 and 2 and a gate terminal 3, the following table represents the four possible modes of operation. In the table, $V_{(2)}$ is considered positive if terminal 2 is more positive than terminal 1, and $I_{(3)}$ is considered positive if current flows into gate terminal 3.

| Mode | V(2) | I(3) (for turn on) |
|---|---|---|
| 1 | + | + |
| 2 | − | − |
| 3 | + | − |
| 4 | − | + |

An examination of the above table makes it apparent that the devices may be switched to their low impedance state in either direction of conduction by triggering impulses of either polarity. Although each device may not be capable of operation in all four modes, the devices may be selectively constructed in order to furnish operation in any modes that are desired. Thus, for example, if it is wished to provide a device operative in the second and third mode, current conduction in either direction through the device may be triggered by impulses having a negative polarity only. On the other hand, if it is desired to operate in the first and second mode, triggering impulses having a polarity similar to that of the direction of conduction (as defined by the symbols used in the table) will be required.

Figure 1A:
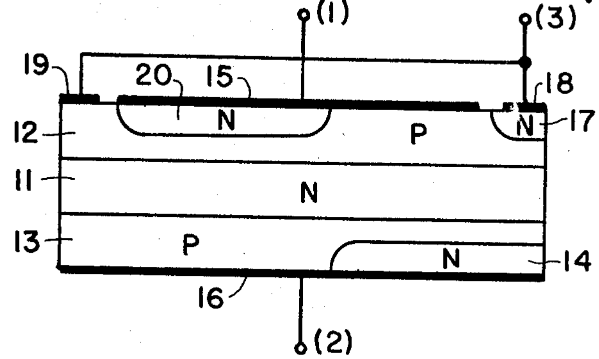
Figure 1B:
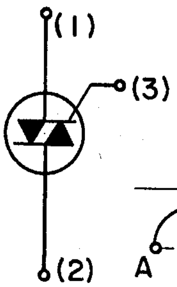

One example of a typical controlled bi-directional current carrying semiconductor is shown in FIG. 1A. This particular structure has been shown and described in detail in the co-pending patent application of F. W. Gutzwiller, Ser. No. 331,776, filed Dec. 19, 1963, now Pat. No. 3,275,909 issued on Sept. 27, 1966, and assigned to the General Electric Company, assignee of the present invention. This device is designed to function primarily in the modes 1 and 2 set forth in the above table. Accordingly, when current carrying terminal 2 is positive with respect to current carrying terminal 1, the device is switchable to a low impedance state by supplying a current into gate terminal 3. When the reverse polarity is applied between the main terminals 1 and 2 the device is switchable to a low impedance state by extracting current from gate terminal 3. Stated another way, conduction from terminal 2 to terminal 1 may be initiated by the application of a positive signal to terminal 3 and conduction from terminal 1 to terminal 2 may be initiated by the application of a negative signal to terminal 3.

The device of FIG. 1A is a multi-layer device having an internal layer 11 of N conductivity type sandwiched by P conductivity type layers 12 and 13. An N conductivity region 14 is formed adjacent or contiguous with an external portion of P layer 13 and an N conductivity type region 20 is formed adjacent or contiguous with an external portion of P layer 12. The N region 20 is only contiguous with a part of P region 12 and is spaced from the sides of the device to leave exposed surfaces of P region 12 on both lateral sides thereof. Electrical contacts for the main current conduction path through the device are provided by low resistance contacts 15 and 16 on the major faces thereof. Electrode 15 contacts the external N region 20 and the exposed portion of the next adjacent P layer 12, and consequently shorts the P-N junction therebetween. Electrode 16 extends over external N layer 14 and the exposed portion of P layer 13 shorting the P-N junction therebetween. As shown in the figure, electrodes 15 and 16 define terminals 2 and 1 of the device respectively.

It may be helpful to note that the device as thus far described constitutes a five layer semiconductor with shorted emitters and is essentially the five layer, two terminal bilateral switch described in the co-pending patent application of Holonyak et al., Ser. No. 838,504, filed Sept. 8, 1959, and assigned to the General Electric Company, assignee of the present invention. This latter device is shown in FIG. 2 and described hereinafter.

In order to establish control over the conduction between terminals 1 and 2 of the device in FIG. 1A, two gate connections are provided. First, an N conductivity type region 17 is established on an external portion of P layer 12 near electrode 15. A low resistance contact 18 is formed on this gate region and gate terminal 3 is connected thereto. Another contact is established with P layer 12 at a point electrically remote from the junction between layers 17 and 12. This second contact is accomplished with electrode 19 which is also connected to terminal 3.

A general understanding of the operation of the controlled bilateral device shown in FIG. 1A will be available if one considers the device as being made up of two portions: the first portion comprising electrodes 15 and 19, N layer 20, P layer 12, N layer 11, P layer 13, and electrode 16; and the second comprising electrodes 15 and 18, N layer 17, P layer 12, N layer 11, P layer 13, N layer 14, and electrode 16. With this hypothetical division of the device it will be appreciated that the first portion represents a standard type silicon controlled rectifier and its functioning may be considered to be analagous to such a device. The second portion represents a remote gate silicon controlled rectifier and its functioning may be considered to be analogous to such a device. The operation and functioning of silicon controlled rectifiers is fully set out in numerous publications including the General Electric Controlled Rectifier Manual, second edition, copyright 1961 by the General Electric Company. The operation and functioning of the remote gate silicon controlled rectifier is fully described and illustrated in the co-pending patent application of Gentry et al., Ser. No. 326,162, filed November 26, 1963, now Pat. No. 3,284,680 issued Nov. 8, 1966, and assigned to the General Electric Company, assignee of the present invention.

Figure 1C:
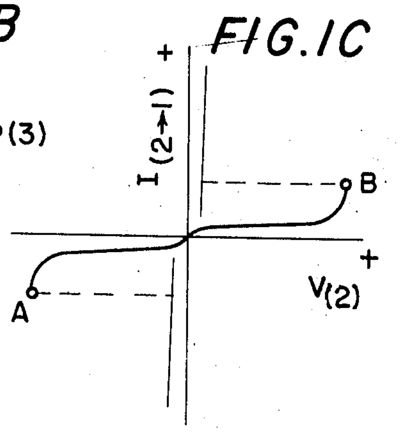

The operation of the device will be briefly considered in conjunction with the typical characteristic curves shown in FIG. 1C. In these curves current flow through terminals 1 and 2 is plotted as ordinates with flow from 2 to 1 being considered positive, and the instantaneous voltage on terminal 2 is plotted as abscissae.

When terminal 2 is positive relative to terminal 1 the two outer layers of the device in FIG. 1A tend to conduct because the P-N junction between layers 13 and 11 and the P-N junction between layers 12 and 20 are forward biased. On the other hand, the center N-P junction between layers 11 and 12 tends to block current flow through the device. This blocking condition may be removed by either raising the total voltage across the junction to a sufficiently high value to force conduction, or by introducing a sufficient amount of current through the gate terminal 3 and electrode 19 to cause a change in the charge condition across the junction. In operation, this is effectively what is done. Without going into a detailed recitation of the distribution and redistribution of electrons and holes within the device, it suffices to say that when sufficient gate current is supplied thereto the space charge at the blocking N-P junction between layers 11 and 12 collapses and within a short while, the device presents a low impedance path for current flow from terminal 2 to terminal 1.

This condition is illustrated in the first quadrant of the characteristic curves of FIG. 1C. Thus, when the voltage on terminal 2 is positive an increase in the voltage does not cause an increased current until "breakover voltage" and "breakover current" is attained at point B and avalanche multiplication begins. Beyond this point, the current increases rapidly until the center junction between layers 11 ad 12 becomes forward-biased. At this time the device goes into a high conduction state. For increasing magnitudes of gate current into terminal 3, the region of the characteristic between the breakover voltage and the conduction voltage is narrowed as the magnitude of the breakover voltage is reduced.

When the voltage on terminal 1 is positive with respect to the voltage on terminal 2 the device in FIG. 1A operates in a somewhat different fashion but is again responsive to a gating impulse on terminal 3 to assume a high conduction state. This polarity on terminals 1 and 2 tends to make the respective P-N junctions between layers 12 and 11 and layers 13 and 14, conductive. However, the N-P junction between layers 11 and 13 tends to block current flow through the device. Once again, it will be appreciated that in order to overcome this blocking condition it is necessary to either raise the voltage across the junction to a high enough value to force conduction thereacross or to extract current from gate terminal 3 in order to change the charge condition appearing at this junction.

The characteristic curve shown in the third quadrant of FIG. 1C illustrates device operation under the last mentioned condition. It will be seen that increasing the voltage between terminals 2 and 1 has little effect until the breakover voltage occurs at point A. After this, the current begins to increase and holes and electrons are redistributed within the various layers of the device until the device switches completely into high conduction.

The brief description hereinabove shows that the controlled bilateral device in FIG. 1A exhibits bidirectional current conducting characteristics and is operative under the control of appropriate polarity triggering impulses on terminal 3 to selectively furnish a low impedance path between terminals 1 and 2. A more detailed explanation of the functioning of such a device is available in the aforecited patent of F. W. Gutzwiller.

Basic power control circuit

Figure 3:
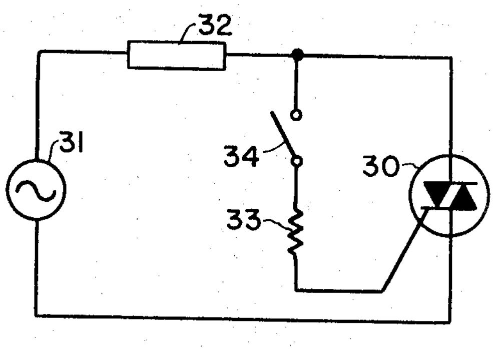
FIG. 3 is a circuit schematic illustrating controlled triggering of a bidirectional current conducting semiconductor for selectively supplying alternating current to a load.

With an appreciation of the characteristics of controlled bilateral devices it is now possible to consider unique power control circuits employing these devices. FIG. 3 represents generally a circuit which permits utlization of the characteristics provided by these devices and provides a package for power control that offers maximum simplicity and economy. The circuit comprises a controlled bilateral device 30 serially connected with an alternating current source 31 and a load 32. The gate terminal of semiconductor 30 is connected to one of its end terminals by means of an impedance 33 and a symbolically indicated switching means 34. The particular end terminal used is determined by the particular operating modes for which semiconductor 30 has been designed; these modes having been defined hereinbefore. It is assumed that semiconductor 30 is designed for operation in modes 1 and 2 and accordingly, when the potential applied to the upper terminal thereof is positive, a positive gating potential is required and the opposite polarity gating potential is required when the upper terminal thereof is negative.

The circuit in FIG. 3 operates in the following manner. The magnitude of the voltage from alternating current source 31 is selected to insure that the breakover voltage is never attained across device 30. Under these conditions, until switch 34 is closed, there is no conduction through load 32. When it is desired to render semiconductor 30 conductive, switch 34 is closed. Upon closure of switch 34, at a point (usually early) in the cycle of current from source 31, depending on the value of resistor 33, sufficient triggering potential is applied to the gate terminal of device 30 to render it conductive. Thereafter, for the remainder of that half cycle, the device presents a low impedance path for current flowing therethrough. During the succeeding half cycle, the gate potential is reversed simultaneously with the reversal of polarity across the terminals of device 30. Accordingly, it is once again rendered conductive and permits the supply of power to load 32. Thus, during closure of switch 34, controlled bilateral device 30 operates with a substantially 100% duty cycle (if resistor 33 is sufficiently small) to furnish alternating current power to the load 32.

The time when power is first applied is determined by closure of switch 34 and the time when power is removed is determined by the next succeeding point of zero current following opening of switch 34. A static switch such as illustrated herein is, of course, of extreme importance for performing switching operations that require high speed operation at high currents or which require an explosion proof switch.

Several particular features of the circuit in FIG. 3 may be noted. First, impedance 33 is a current limiting resistor and its impedance is determined by the needs of the circuitry. It is entirely within the scope of the invention to remove this impedance under appropriate operating conditions. Second, as illustrated, the controlled bilateral device 30 and its associated control elements 33 and 34 present a two-terminal network to the alternating current supply 31 and load 32. They may be fabricated in a unitary package for serial inclusion in the circuit. It is, of course, also possible to connect switch 34 directly to one terminal of alternating current source 31. In this instance, the advantages of being able to fabricate the controlled bilateral device and its control circuitry in a single two-terminal package would not be available.

It is possible to obtain advantages by devising other circuits for controlling these bilateral devices. Examples of these circuits are illustrated in FIGS. 4 through 7. Before proceeding with a discussion of the operation of such circuits, however, it is necessary to consider another semiconductor element which is uniquely adapted to assist in attaining the optimum characteristics from the control circuits associated with such bilateral devices. Accordingly, the device in FIG. 2A will be considered.

Two-terminal bydirectional current conducting semiconductor

Figure 2A:
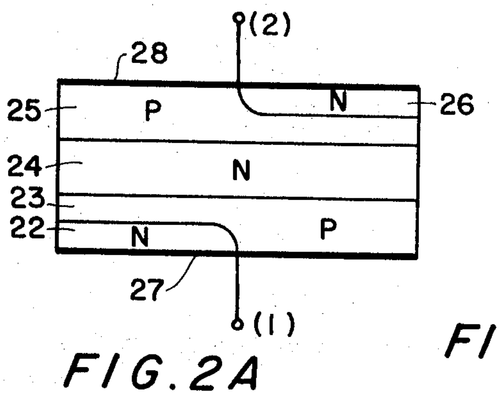
Figure 2B:
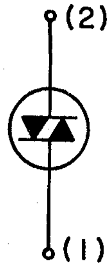

The diagram of FIG. 2A illustrates a bilateral semiconductor which is designed to conduct current in either direction when the applied voltage in the desired direction exceeds a predetermined amount. A detailed discussion and description of this device is available in the copending patent application of N. Holonyak et al., Ser. No. 838,504 filed Sept. 8, 1959 and assigned to the General Electric Company, assignee of the present invention. It is also described in an article entitled "Two-Terminal Asymmetrical and Symmetrical Silicon Negative Resistance Switches" by R. W. Aldrich and N. Holonyak, Jr., in the Journal of Applied Physics, vol. 30, No. 11, pages 819–824, November 1959.

Figure 2C:
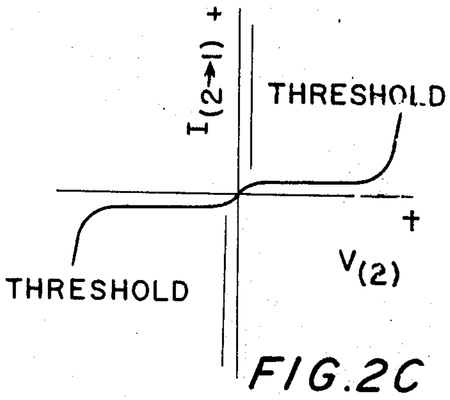

In view of the previous discussion of controlled bilateral devices in conjunction with FIG. 1, the operation of the semiconductor device in FIG. 2 will be apparent. This is a bilateral device that switches to a low impedance state whenever the voltage across its two terminals exceeds a predetermined threshold value. The typical characteristic curves in FIG. 2C visually illustrate such operation. As distinguished from the controlled bilateral semiconductors typified by the device in FIG. 1, the FIG. 2 devices cannot be controlled with independent triggering signals. From an operational aspect, if terminal 1 is made positive with respect to terminal 2, the P-N junctions between layers 22 and 24 and layers 25 and 26 are forward biased and therefore, tend to conduct; however, the N-P junction between layers 24 and 25 is in a blocking state. This blocking state is overcome only when the applied potential attains a predetermined threshold magnitude. Once this magnitude is attained, an avalanche condition develops that switches the device into a high conduction state. Inasmuch as the device is symmetrical when viewed from either electrode, it will be appreciated that its operation is identical in response to either polarity of applied voltage.

Figure 4:
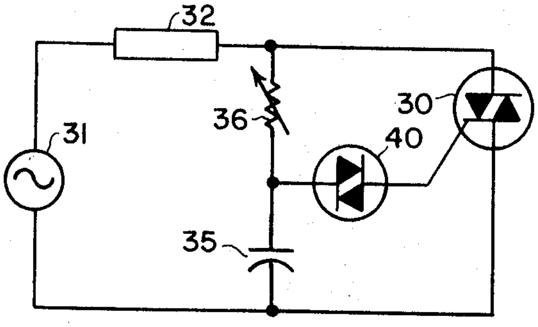
FIG. 4 is a circuit schematic illustrating a phase controlled triggering circuit for establishing the conduction interval of a bidirectional current conducting semiconductor in accordance with desired operation.
Figure 5:
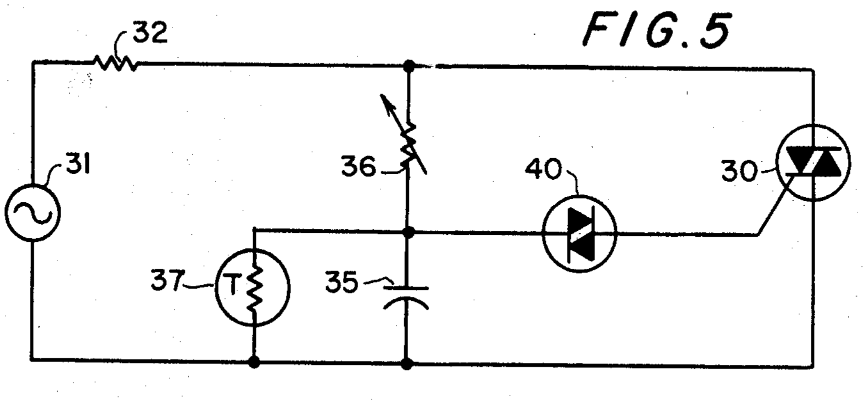
FIG. 5 is a circuit schematic illustrating the phase controlled triggering of a bidirectional current conducting semiconductor as part of a closed loop control circuit for establishing the amount of power supplied to a load in accordance with a characteristic of the load.

FIGS. 4, 5 and 6 each utilize this or similar types of two-terminal bilateral devices such as neon bulbs, three-layer semiconductor trigger devices, etc., in combination with timing circuitry, to selectively apply alternating polarity control signals on successive half cycles to the gate electrode of a controlled bilateral semiconductor.

Further power control circuits

The circuit in FIG. 4 comprises alternating current source 31, load 32, and controlled bilateral semiconductor 20 connected in series. A phase controlled triggering circuit comprising a variable resistance 36, a capacitor 35, and a two-terminal bilateral device 40 is connected to selectively supply a triggering signal to semiconductor 30 at controlled instants of time within each half cycle of the alternating current from source 31. Variable resistance 36 is serially connected with capacitor 35 across the two main current carrying terminals of controlled bilateral device 20 and the trigger device 40 interconnects the junction of elements 35 and 36 to the gate terminal of device 20. As also mentioned with respect to the circuit of FIG. 3, this configuration offers the advantage of a two-terminal switching package for control over the power applied to load 32. Of course, here too, if desired, the phase controlled circuit could be directly connected across source 31 or it could even be independently supplied.

In operation, as the voltage applied by source 31 increases, capacitor 35 begins to accumulate charge at a rate determined by the time constant established jointly with variable resistor 36. When the voltage across capacitor 35 attains the threshold or breakover voltage of bilateral semiconductor 40, it switches to a low impedance state furnishing a low impedance path to the gate electrode of semiconductor 30. Capacitor 35 discharges in this path and controlled bilateral device 30 assumes a low impedance state. Power is supplied via device 30 to load 32 for the remainder of the half cycle. At the commencement of the succeeding half cycle, when the load current goes through zero, device 30 resumes its high impedance state and remains nonconductive until capacitor 35 is once again charged to the threshold voltage of bilateral semiconductor 40. In a complete cycle of operation, therefore, capacitor 35 charges in both polarities. At some time during each of the charging intervals, the threshold voltage of device 40 is attained and the capacitor discharges into the gate terminal of semiconductor 30 which thereupon switches power to the load. Control over the instant of time at which this load switching occurs is determined by the value of variable resistor 36 and, of course, this resistor may be set either manually or in accordance with some predesired control function.

With adequate triggering sensitivity of device 30, it is possible to attain a reasonable degree of phase control even without a triggering device 40.

An interesting characteristic of the FIG. 4 circuit should be considered at this point. This characteristic relates to the initially unsymmetrical triggering on successive half cycles which will result when an operating cycle is initiated by gradually decreasing the impedance of resistor 36 until the charge on capacitor 35 attains a magnitude sufficient to overcome the threshold of device 40. It will be appreciated that resistor 36 may have a magnitude which establishes a time constant of too long a duration to permit capacitor 35 to attain the breakover voltage during any half cycle of the alternating current supply. Starting at this point and slowly decreasing the resistance, an impedance magnitude will be reached which will just permit capacitor 35 to attain the breakover voltage. At this time capacitor 35 discharges into the gate of controlled semiconductor 30 rendering it conductive and permitting the load to receive full power from the alternating current source 31. During the half cycle immediately prior to the triggering half cycle, capacitor 35 was charged in the opposing polarity to a magnitude slightly below the breakover voltage of device 40. Accordingly, during the switching half cycle the charge on the capacitor had to be modified by a magnitude approximately equivalent to twice the threshold voltage of device 40. Once switching has begun, however, the subsequent charging of capacitor 35 only requires the development of a voltage magnitude approximately equivalent to the threshold voltage of device 40. It will be immediateely apparent that the period of time to attain this latter charge is substantially less than that which was required to first initiate triggering. Thus, the setting of variable resistor 36 at which switching began will be considerably lower than that required to sustain such switching. For a short period after initiating switching in this way, the described "hysteresis-like" effect will cause capacitor 35 to charge unsymmetrically and semiconductor 30 will consequently be triggered unsymmetrically. However, symmetry will be soon attained with a few cycles and thereafter readjustment of resistor 36 will permit an increase or decrease in the duty cycle of semiconductor 30.

As already noted, it is possible to automatically vary the impedance of resistor 36 in accordance with desired control criteria. From one aspect this will furnish a feedback loop whereby a characteristic of the load is monitored to control the power applied thereto. Another technique for providing this feedback or closed-loop effect is shown by the circuit of FIG. 5.

FIG. 5 is substantially the same as its predecessor, differing only in that load 32 is specifically represented as a heat generating medium and in that a heat responsive thermistor 37 is connected in parallel with timing capacitor 35. This circuit is designed to hold a constant temperature on heat generating load 32. As the temperature of the load increases, the resistance of the physically proximate thermistor 37 decreases thereby shunting current away from the capacitor 35 and reducing the rate at which it charges. This increases the amount of time required for capacitor 35 to attain the threshold voltage of bilateral device 40 and this, in turn, delays the switching of controlled bilateral device 30. By delaying switching, the amount of power delivered to load 32 is reduced and the amount of heat generated is reduced. Obviously, other feedback and control elements may be substituted for the thermistor. The important concept and result to be recognized with respect to this particular circuit is the closed-loop control exemplified thereby.

In the circuits of FIGS. 4 and 5 a "hysteresis-like" effect has been described when the variable resistor 36 is decreased in magnitude in order to initiate an operating cycle. It should also be recognized that due to the employment of a single time constant circuit these circuits both have a somewhat limited range of phase control inasmuch as the capacitor voltage approaches zero as 90° phase shift is approached.

In order to improve the range of phase control, the double time constant phase shift circuit shown in FIG. 6 may be used. This circuit differs from FIG. 4 because a tapped potentiometer 38 is substituted for variable resistor 36 and a capacitor 41 is connected between the tap 39 on potentiometer 38 and one terminal of the alternating current source 31. With high resistance settings of potentiometer 38 a relatively large phase shift is created by the triggering control circuitry. At such settings, capacitor 41 is in series with the upper unshorted portion of potentiometer 38 and the sliding contact thereof and charges at a first rate, while capacitor 35 is in series with the entire unshorted portion of potentiometer 38 and the sliding contact thereof charges at a second rate. A smaller phase shift is created by lower resistance settings of potentiometer 38. With such lower settings, i.e., when the sliding contact is positioned close to or below tap 39, capacitor 41 has little or no effect upon the charging time.

It will be appreciated that by utilizing two time constants the voltage amplitude across capacitor 35 will be significant even at a phase shift of 90°. Thus, with double time constant control circuitry, a broader range of phase control is available. It may be noted, however, that when the phase shifts approach 180°, there will be a small hysteresis effect in the operation of the entire power control circuit.

Still another circuit for developing switching signals for a controlled bilateral semiconductor is shown in FIG. 7. In this circuit a saturable reactor is employed to establish the instant in time during each half cycle of supply voltage at which switching of the bilateral semiconductor is to occur. As illustrated, winding 51 of a saturable transformer 50 is serially connected between a resistor 42 and a resistor 44 across the current carrying terminals of semiconductor 30. The gate terminal of semiconductor 30 is connected to the junction between saturable reactor winding 51 and resistor 44. Capacitor 35 is connected to the junction between saturable reactor winding 51 and resistor 42, having its other terminal connected to the alternating current source 31. A control signal source 45 is connected across the control winding 52 of saturable reactor 50 in order to control the degree of saturation thereof. It is well recognized that the selective application of a direct current to a saturable reactor will control the instant in time at which such devices will saturate. Those familiar with such devices will recognize that the control signal source may take any number of forms including a simple short circuit.

In a typical operating cycle during each half of the input cycle from source 31 capacitor 35 is charged in the path including load 32, resistor 42, and source 31. If saturable reactor 50 is maintained in saturation, the current through resistor 44 is limited by resistor 42 to an amount insufficient to produce enough voltage to trigger controlled bilateral semiconductor 30. When the reactor becomes unsaturated under control of control signal source 45, capacitor 35 will begin charging and upon subsequent saturation of reactor 50 it will discharge via winding 51 and resistance 44 producing a sufficient magnitude of voltage to trigger bilateral semiconductor 30. This circuit can be designed to permit firing of the controlled bilateral semiconductor within a fraction of a millisecond after the beginning of each half cycle. It will obviously be apparent that the control signal source 45 in FIG. 7 is electrically isolated from the control circuit itself and it will be recognized that this is often an important characteristic of power control circuits.

A number of specific illustrative embodiments of the present invention have been illustrated. Each of these embodiments teaches a unique combination of elements including a single controlled bilateral semiconductor device for establishing control over the amount of alternating current delivered to a load. It will, of course, be understood that it is not wished to be limited to these specific embodiments since modifications may be made both in the circuit arrangements and in the instrumentalities employed and it is contemplated in the appended claims to cover any such modifications as fall within the true spirit and scope of the invention.

What is claimed as new and desired to be secured by Letters Patent of the United States is:

1. A circuit for connection to a source of current and a load comprising in combination, a bidirectional current conducting semiconductor normally exhibiting a high impedance between two terminals thereof and exhibiting a low impedance therebetween in response to the application of a signal having an amplitude greater than a predetermined magnitude to a third terminal thereof, the minimum value of said signal necessary to cause said low impedance being the same for both directions of current flow between said two terminals, control means operative to apply a signal characterized by an amplitude of at least said minimum value between said third terminal and the same one of said two terminals for both directions of current flow between said two terminals, and means responsive to the characteristic of the load to modify the operation of said control means.

2. The circuit as recited in claim 1 wherein means are provided for supplying said control means with power having a magnitude commensurate with that supplied to the load.

3. A circuit for connection to a source of current and a load comprising in combination, a bidirectional current conducting semiconductor normally exhibiting a high impedance between two terminals thereof and exhibiting a low impedance therebetween in response to the application of a signal having an amplitude greater than a predetermined magnitude and a polarity which is different for each direction of current flow between said two terminals to a third terminal thereof, the minimum value of said signal necessary to cause said low impedance being the same for both directions of current flow between said two terminals, control means operative to apply a signal characterized by an amplitude of at least said minimum value between said third terminal and the same one of said two terminals for both directions of current flow between said two terminals and a polarity which is different for each direction of current flow between said two terminals, said control means including first and second energy storage means, variable impedance means connecting each of said energy storage means to said source of current and operative to selectively supply power thereto with discrete charging rates, coupling means connecting the junction between said variable impedance means and said first energy storage means in said circuit between the third terminal of said semiconductor and the same one of said terminals for both directions of current flow between said two terminals, said coupling means being operative when the magnitude of the voltage on said first energy storage means exceeds at least said predetermined magnitude to furnish a low impedance path therebetween.

4. A circuit for connection to a source of current and a load comprising in combination, a bidirectional current conducting semiconductor normally exhibiting a high impedance between two terminals thereof and exhibiting a low impedance therebetween in response to the application of a signal having an amplitude greater than a predetermined magnitude and a polarity of which is different for each direction of current flow between said two terminals to a third terminal thereof, the minimum value of said signal necessary to cause said low impedance being the same for both directions of current flow between said two terminals, control means operative to apply a signal characterized by an amplitude of at least said minimum value between said third terminal and the same one of said two terminals for both directions of current flow between said two terminals and a polarity which is different for each direction of current flow between said two terminals, said control means comprising energy storage means, charging means connected to said energy storage means and operative selectively to supply power thereto at a controllable rate, and means connecting said energy storage means between the third terminal of said semiconductor and the same one of said two terminals for both directions of current flow between said two terminals and operative in response to at least a predetermined voltage level on said energy storage means to furnish a low impedance discharge path therebetween.

5. The circuit as recited in claim 4 and further defined by means connected to said energy storage means and responsive to a varying characteristic of the load commensurately to modify the charging rate of said energy storage means.

6. The circuit as recited in claim 4 wherein said energy storage means comprises a first and second capacitor, each charged at discretely controlled rates by said charging means.

7. A circuit for connection to a source of alternating current and a load comprising in combination, a bidirectional current conducting semiconductor normally exhibiting a high impedance between two terminals thereof and exhibiting a low impedance therebetween in response to the application of a signal having an amplitude greater than a predetermined magnitude to a third terminal thereof, control means for developing a signal having an alternating polarity on successive half cycles of said alternating current and having an instantaneous amplitude that attains a value greater than said predetermined magnitude during successive half cycles of said alternating current, said control means further including means for applying said signal between said third terminal and the same one of said two terminals for both directions of current flow between said two terminals, means for varying the phase of said signal with respect to said alternating current, and means for supplying said control means with power having a proportional relationship to the power applied to the load from said alternating current source.

8. A circuit for connection to a source of alternating current and a load comprising in combination, a bidirectional current conducting semiconductor normally exhibiting a high impedance between two terminals thereof and exhibiting a low impedance therebetween in response to the application of a signal having an amplitude greater than a predetermined magnitude to a third terminal thereof, control means for developing a signal having an alternating polarity on successive half cycles of said alternating current and having an instantaneous amplitude that attains a value greater than said predetermined magnitude during successive half cycles of said alternating current, said control means further including means for applying said signal between said third terminal and the same one of said two terminals for both directions of current flow between said two terminals, means for varying the phase of said signal with respect to said alternating current, said control means comprises a control circuit for developing said signal, said control means further including coupling means connected between the output of said control circuit and said third terminal and operative when the magnitude of the signal from said control circuit exceeds at least said predetermined magnitude to furnish a low impedance path therebetween.

9. A circuit for connection to a source of alternating current and a load comprising in combination, a bidirectional current conducting semiconductor normally exhibiting a high impedance between two terminals thereof and exhibiting a low impedance therebetween in response to the application of a signal having an amplitude greater than a predetermined magnitude to a third terminal thereof, control means for developing a signal having an alternating polarity on successive half cycles of said alternating current and having an instantaneous amplitude that attains a value greater than said predetermined magnitude during successive half cycles of said alternating current, said control means further including means for applying said signal between said third terminal and the same one of said two terminals for both directions of current flow between said two terminals, means for varying the phase of said signal with respect to said alternating current, the required polarity of said control signals to effect switching to said low impedance characteristic is determined by the polarity of the power applied to said two terminals, said control means including energy storage means, charging means for charging said energy storage means connected to said source of alternating current and operative to supply power thereto at a controllable rate, said controllable rate being such that the voltage level attained on said energy storage means attains a value greater than said minimum required magnitude during successive half cycles of said alternating current, and means connecting said energy storage means between the third terminal of said semiconductor and the same one of said two terminals for both directions of current flow between said two terminals and operative in response at least a predetermined voltage level on said energy storage means to furnish a low impedance discharge path therebetween.

10. The circuit as recited in claim 9 wherein said energy storage means comprises a first and second capacitor, each charged at discretely controlled rates by said charging means.

11. A circuit for connection to a source of alternating current and a load comprising in combination, a bidirectional current conducting semiconductor normally exhibiting a high impedance between two terminals thereof and exhibiting a low impedance therebetween in response to the application of a signal having an amplitude greater than a predetermined magnitude to a third terminal thereof, the minimum value of said signal necessary to cause said low impedance being the same for both directions of current flow between said two terminals, control means for developing a signal having an instantaneous amplitude that attains a value greater than said predetermined magnitude during successive half cycles of said alternating current, said control means further including means for applying said signal between said third terminal and the same one of said two terminals for both directions of current flow between said two terminals, and means responsive to a characteristic of said load for varying the phase of said signal with respect to said alternating current.

12. The circuit as recited in claim 11 wherein said control circuit comprises energy storage means charged from said source of alternating current when said saturable means is unsaturated and adapted to discharge when said saturable means is saturated, thereby producing a signal having an amplitude greater than said predetermined magnitude.

13. The circuit as recited in claim 12 in combination with means for initially saturating and controllably desaturating said saturable means during successive half cycles of alternating current from said source.

14. A circuit for connection to a source of alternating current and a load comprising in combination, a bidirectional current conducting semiconductor normally exhibiting a high impedance between two terminals thereof and exhibiting a low impedance therebetween in response to the application of a signal having an amplitude greater than a predetermined amgnitude to a third terminal thereof, the minimum value of said signal necessary to cause said low impedance being the same for the both directions of current flow between said two terminals, control means for developing a signal having an instantaneous amplitude that attains a value greater than said predetermined magnitude during successive half cycles of said alternating current, said control means further including means for applying said signal between said third terminal and the same one of said two terminals for both directions of current flow between said two terminals, means for varying the phase of said signal with respect to said alternating current, said control means comprising a control circuit including saturable magnetic means connected across said source of alternating current and applying a control signal between the third terminal and the same one of said two terminals for both directions of current flow between said two terminals, said saturable means selectively operative to exhibit a high or low impedance characteristic when saturated, respectively, and means for controlling the phase of said control signal with respect to the alternating current from said source to selectively attain an amplitude greater than said predetermined magnitude at desired instants within successive half cycles.

15. In combination a bidirectional current conducting semiconductor device, said device comprising a body of semiconductor material including five layers of one and the opposite conductivity types, layers of one conductivity type being interleaved with layers of the opposite conductivity type forming a plurality of P-N junctions therein, a first main current carrying electrode in low resistance ohmic contact with the surface of an external layer of said body and an exposed surface of an adjacent intermediate layer, a second main current carrying electrode in low resistance ohmic contact with the surface of the other external layer of said body and an exposed surface of the adjacent intermediate layer, a gate region of the same conductivity type as said external layers of said body, adjacent said intermediate layers contacted by the said first main current carrying electrode and third electrode means in ohmic contact with said gate region and with the adjacent intermediate layer and normally exhibiting a high impedance characteristic between said two main current carrying electrodes thereof and exhibiting a low impedance characteristic therebetween in response to the flow of current of an amplitude greater than a predetermined magnitude between said third electrode and the same one of said two main current carrying electrodes for both directions of current flow between said two terminals, means for serially connecting said two main current carrying electrodes in a current carrying path between an alternating current source and a load, means for controlling one direction of current flow from said source to said load between said two terminals comprising means for applying only a portion of the voltage from said source between said third and said one of said two electrodes, said portion being sufficient to establish said predetermined magnitude of current flow, means for controlling the other direction of current flow from said source to said load between said two electrodes comprising means for applying only a portion of the voltage from said source between said third terminal and said same one of said two terminals, said last named portion being sufficient to establish said predetermined magnitude of said current flow.

16. A circuit for connection in circuit with a source of alternating voltage of a given magnitude and a load comprising in combination, a monolithic bidirectional current conducting semiconductor normally exhibiting a high impedance between two terminals thereof and exhibiting a low impedance therebetween in response to the flow of current of an ampiltude greater than the predetermined magnitude between a third terminal thereof and the same one of said two terminals for both directions of current flow between said two terminals, means for controlling one direction of current flow from said source to said load between said two terminals comprising means for applying only a portion of the voltage from said source between said third and said one of said two terminals, said portion being sufficient to establish said predetermined magnitude of said current flow, means for controlling the other direction of current flow from said source to said load between said two terminals comprising means for applying only a portion of the voltage from said source between said third terminal and said same one of said two terminals, said last named portion being sufficient to establish the predetermined magnitude of said 17. A circuit for connection in circuit with a source of alternating voltage of a given magnitude and a load comprising in combination a monolithic bidirectional current conducting semiconductor normally exhibiting a high impedance between two main current carrying terminals thereof and exhibiting a low impedance therebetween in response to the flow of current of an amplitude greater than a predetermined magnitude between a third terminal thereof and the same one of said terminals for both directions of current flow between said two terminals, means for connecting one terminal of a two terminal source to one main current carrying terminal of said semiconductor, means for connecting the second terminal of said two terminal source to the second main current carrying terminal of said semiconductor comprising a load circuit, means for controlling one direction of current flow from said source to said load between said two main current carrying terminals comprising means for applying only a portion of the voltage from said source between said third and said one of said two terminals, said means for applying comprising a current limiting impedance and a switch connecting said terminal of said semiconductor to the first terminal of said source, said portion being sufficient to establish said predetermined magnitude of current flow, means for controlling the other direction of current flow from said source to said load between said two terminals comprising means for applying only a portion of the voltage from said source between said third terminal and said same one of said two terminals, said last named means for applying comprising said last named current limiting impedance and switch connecting said third terminal of said semiconductor to said first terminal of said source, said last named portion being sufficient to establish said predetermined magnitude of said current flow.

18. A circuit for connection to a source of current and a load comprising in combination, a bidirectional current conducting semiconductor normally exhibiting a high impedance between two main terminals thereof and exhibiting a low impedance therebetween for both directions of current flow between said main terminals in response to the application of a signal to a third terminal thereof having a signal amplitude greater than a predetermined magnitude and a signal polarity which is different for each direction of current flow between said main terminals, a control means operative to apply a signal between said third terminal and the same one of said two terminals to control both directions of current flow between said two main terminals characterized by a signal amplitude of at least said minimum required amplitude and a different polarity for each direction of current flow between said main terminals.

19. An arrangement according to claim 18 wherein the polarity of said signal applied between said third terminal and said same one terminal is the same as the polarity developed between the other of said main terminals and said same one terminal.

20. An arrangement according to claim 19 wherein the applied signal has an amplitude which is less than the line voltage and which is substantially of the same amplitude for each direction of current flow between said two main terminals.

References Cited

UNITED STATES PATENTS

| | | | |
|---|---|---|---|
| 3,210,641 | 10/1965 | Hutson | 321—46 |
| 3,266,021 | 8/1966 | Druz et al. | 340—171 |
| 3,275,909 | 9/1966 | Gutzwiller | 317—235 |
| 3,284,639 | 11/1966 | Giuliano et al. | 307—305 XR |
| 3,317,746 | 5/1967 | Hutson | 307—305 |
| 3,351,826 | 11/1967 | Hermann | 317—235 |

WILLIAM M. SHOOP, Jr., Primary Examiner

U.S. Cl. X.R.

307—305

UNITED STATES PATENT OFFICE
CERTIFICATE OF CORRECTION

Patent No. 3,535,615 Dated October 20, 1970

Inventor(s) E. Keith Howell and Frank W. Gutzwiller

It is certified that error appears in the above-identified patent and that said Letters Patent are hereby corrected as shown below:

Column 1, line 40, cancel "ducing" and insert -- ducting --. Column 6, line 5, cancel "ad" and insert -- and --; line 47, cancel "utliza" and insert -- utiliza --. Column 7, line 45, cancel "bydirectional" and insert -- bidirectional --; line 72, cancel "22" and insert -- 23 --. Column 8, lines 17, 25 and 27, cancel "20" and insert -- 30 --. Column 9, line 14, cancel "immediateely" and insert -- immediately --.

Column 14, line 59, after "said" insert -- current flow --; line 67, after "third" insert -- gating --; line 68, after "said" insert -- two --. Column 15, line 7, after "said" insert -- third --.

Column 13, line 50, cancel "the", second occurrence.

Signed and sealed this 4th day of January 1972.

(SEAL)
Attest:

EDWARD M.FLETCHER,JR.
Attesting Officer

ROBERT GOTTSCHALK
Acting Commissioner of Patents

FORM PO-1050 (10-69)

USCOMM-DC 60376-P69
☆ U.S. GOVERNMENT PRINTING OFFICE : 1969 O—366-334